(12) United States Patent
Jamison

(10) Patent No.: US 9,519,031 B2
(45) Date of Patent: Dec. 13, 2016

(54) CIRCUITS AND METHODS FOR IMPEDANCE DETERMINATION USING ACTIVE MEASUREMENT CANCELATION

(71) Applicant: BATTELLE ENERGY ALLIANCE, LLC, Idaho Falls, ID (US)

(72) Inventor: David K. Jamison, Idaho Falls, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 344 days.

(21) Appl. No.: 14/108,068

(22) Filed: Dec. 16, 2013

(65) Prior Publication Data

US 2015/0168500 A1 Jun. 18, 2015

(51) Int. Cl.
*G01R 27/02* (2006.01)
*G01R 31/36* (2006.01)

(52) U.S. Cl.
CPC ........... *G01R 31/3662* (2013.01); *G01R 27/02* (2013.01); *G01R 31/3679* (2013.01)

(58) Field of Classification Search
CPC ................................................ G01R 31/3662
USPC ....................................................... 324/430
See application file for complete search history.

(56) References Cited

U.S. PATENT DOCUMENTS

| | | | |
|---|---|---|---|
| 5,365,453 A * | 11/1994 | Startup | G01R 31/3648 320/136 |
| 7,274,100 B2 | 9/2007 | Pavier et al. | |
| 7,592,778 B2 | 9/2009 | Ooshita et al. | |
| 2010/0123436 A1 | 5/2010 | Herrod et al. | |
| 2011/0077880 A1 | 3/2011 | Gering | |
| 2011/0270559 A1* | 11/2011 | Christophersen | G01R 27/26 702/65 |
| 2012/0139553 A1* | 6/2012 | Nortman | H02J 7/0016 324/537 |
| 2014/0009164 A1* | 1/2014 | Suzuki | G01R 31/3624 324/430 |
| 2014/0132220 A1 | 5/2014 | Jamison | |

* cited by examiner

*Primary Examiner* — Drew A Dunn
*Assistant Examiner* — Jerry D Robbins
(74) *Attorney, Agent, or Firm* — TraskBritt

(57) ABSTRACT

A delta signal and opposite delta signal are generated such that a sum of the two signals is substantially zero. The delta signal is applied across a first set of electrochemical cells. The opposite delta signal is applied across a second set of electrochemical cells series connected to the first set. A first held voltage is established as the voltage across the first set. A second held voltage is established as the voltage across the second set. A first delta signal is added to the first held voltage and applied to the first set. A second delta signal is added to the second held voltage and applied to the second set. The current responses due to the added delta voltages travel only into the set associated with its delta voltage. The delta voltages and the current responses are used to calculate the impedances of their associated cells.

30 Claims, 10 Drawing Sheets

$\Delta V_1 + \Delta V_2 + ... = 0$

| | Sys 1 | Sys 2 | Sys 3 | Sys 4 | Sys 5 | Sys 6 |
|---|---|---|---|---|---|---|
| Time 1 | +0.05V | -0.01 | -0.01 | -0.01 | -0.01 | -0.01 |
| Time 2 | -0.01 | +.05V | -0.01 | -0.01 | -0.01 | -0.01 |
| Time 3 | -0.01 | -0.01 | +.05V | -0.01 | -0.01 | -0.01 |
| Time 4 | -0.01 | -0.01 | -0.01 | +.05V | -0.01 | -0.01 |
| Time 5 | -0.01 | -0.01 | -0.01 | -0.01 | +.05V | -0.01 |
| Time 6 | -0.01 | -0.01 | -0.01 | -0.01 | -0.01 | +.05V |

|  | Sys 1 | Sys 2 | Sys 3 | Sys 4 | Sys 5 | Sys 6 |
|---|---|---|---|---|---|---|
| Time 1 | +0.15V | -0.01 | -0.02 | -0.03 | -0.04 | -0.05 |
| Time 2 | -0.05 | +0.15V | -0.01 | -0.02 | -0.03 | -0.04 |
| Time 3 | -0.04 | -0.05 | +0.15V | -0.01 | -0.02 | -0.03 |
| Time 4 | -0.03 | -0.04 | -0.05 | +0.15V | -0.01 | -0.02 |
| Time 5 | -0.02 | -0.03 | -0.04 | -0.05 | +0.15V | -0.01 |
| Time 6 | -0.01 | -0.02 | -0.03 | -0.04 | -0.05 | +0.15V |

*FIG. 5B*

|  | Sys 1 | Sys 2 | Sys 3 | Sys 4 | Sys 5 | Sys 6 |
|---|---|---|---|---|---|---|
| Time 1 | -0.15V | +0.01 | +0.02 | +0.03 | +0.04 | +0.05 |
| Time 2 | +0.05 | -0.15V | +0.01 | +0.02 | +0.03 | +0.04 |
| Time 3 | +0.04 | +0.05 | -0.15V | +0.01 | +0.02 | +0.03 |
| Time 4 | +0.03 | +0.04 | +0.05 | -0.15V | +0.01 | +0.02 |
| Time 5 | +0.02 | +0.03 | +0.04 | +0.05 | -0.15V | +0.01 |
| Time 6 | +0.01 | +0.02 | +0.03 | +0.04 | +0.05 | -0.15V |

CIRCUITS AND METHODS FOR IMPEDANCE DETERMINATION USING ACTIVE MEASUREMENT CANCELATION

CONTRACTUAL ORIGIN

This invention was made with government support under Contract Number DE-AC07-051D14517 awarded by the United States Department of Energy. The government has certain rights in the invention.

FIELD

The present disclosure relates generally to the field of batteries and, more particularly, to measurement of impedance in batteries.

BACKGROUND

A battery converts stored chemical energy to electrical energy, which may be conveyed as a voltage source. As a battery ages its storage capacity will decrease (i.e., fade) between a Beginning Of Life (BOL) and an End Of Life (EOL). Therefore, observations of battery parameters, such as impedance, may be helpful in determining charge level of a battery and an overall State Of Health (SOH) of a battery over its service life.

For many systems with batteries, such as electric vehicles, impedance measurements of batteries usually need to be performed in-situ without disconnecting the terminals of the battery to make measurements. This in-place measurement is conventionally performed by placing a shunt impedance in series with the battery and injecting a signal into the shunt and battery.

FIG. 1 is a simplified diagram of a conventional impedance measurement system 100. A Device Under Test (DUT) 110 (e.g., a battery, which is also referred to herein as an electrochemical cell) is normally coupled with a source/load circuit 120 between nodes 0 and 1. The source/load circuit 120 may supply recharging energy to the battery 110 and consume energy from the battery 110 during discharging. A shunt resistor 140 is placed in series with the battery 110 and between nodes 1 and 2. A three-point measurement system 130 may be placed in the circuit to possibly measure impedances between nodes 1 and 2, between nodes 2 and 0, and between nodes 1 and 0.

The shunt resistor 140 effectively separates the impedance of the battery 110 from the impedance of the source/load circuit 120. With the separated impedances, the three-point measurement system 130 can separately determine the impedance of the battery 110. These measurements may employ a passive system or an active system. In a passive system the measurements system 130 measures impedances without injecting any signal into the overall system 100. The system 130 waits for an adequate current fluctuation driven by the source/load circuit 120 and monitors the system response. However, timely measurements are difficult to obtain if a sufficient current change does not elicit a sufficient response change from the system 100. The response change is generally referred to as a signal of opportunity when relatively large current changes within the system 100 produce relatively large voltage responses from the battery 110. In many systems 100, it is not always feasible to wait for signals of opportunity to perform impedance measurements.

In active systems, the measurement system 130 injects a signal into the system 100. Since the signal is injected on demand, the system response can be correlated with the impedances of the various elements between the points of the three-point measurements system 130, at any time. The change allows the system to calculate the impedance of the battery 110 using the formula: $Z = \Delta V / \Delta I$.

In both active and passive systems, measurement impedance of the battery 110 may be calculated as follows:

$$\Delta I = ((V1_{t2} - V2_{t2}) - (V1_{t1} - V2_{t1}))/R_{shunt} = \Delta V_{Rshunt}/R_{shunt}$$

Battery impedance: $Z_{DUT} = ((V2_{t2} - V0_{t2}) - (V2_{t1} - V0_{t1}))/\Delta I = \Delta V_{DUT}/\Delta V_{Rshunt} * R_{shunt}$ Source/Load impedance: $Z_{Source/Load} = ((V1_{t2} - V0_{t2}) - (V1_{t1} - V0_{t1}))/\Delta I = \Delta V_{source/Load}/\Delta V_{Rshunt} * R_{shunt}$ Where the subscripted variables $_{t1}$, $_{t2}$ represent voltage samples taken at time $_{t1}$ before and time $_{t2}$ after a significant change in voltage levels in the system 100.

A problem with active systems is that the signal injected by the measurement system 130 into the overall system 100, passes into both the battery 110 and the source/load circuit 120. An additional problem with both active and passive systems is that the shunt impedance 140 is needed to determine system current and causes losses in the system 100.

There is a need for methods and circuits for use with batteries and other electrical components to measure impedance of such components without using shunts 140 in the system under test or applying signals that stray outside of the DUT 110.

SUMMARY

Embodiments of the present disclosure provide an active measurement cancelation system that applies and cancels an active delta signal to determine impedance of a device under test.

Embodiments of the present disclosure include an impedance measurement circuit, which includes a signal creator configured to generate a delta signal and an opposite delta signal such that a sum of the delta signal and the opposite delta signal are substantially zero at any instant of time. A first application circuit is configured to apply the delta signal across a first set of cells comprising one or more electrochemical cells of a plurality of electrochemical cells operably coupled together. A second application circuit is configured to apply the opposite delta signal across a second set of cells comprising one or more electrochemical cells of the plurality of electrochemical cells, wherein the second set of cells is different from the first set of cells. A measurement unit is configured to measure a response signal across the second set of cells when the delta signal and the opposite delta signal are being applied.

Embodiments of the present disclosure include an impedance measurement circuit, which includes an active measurement unit. The active measurement unit is configured to generate a delta signal and apply the delta signal across a first set of cells comprising one or more electrochemical cells of a plurality of electrochemical cells operably coupled together. The active measurement unit is also configured to measure a response signal across the first set of cells when the delta signal is being applied. An inverter unit is configured to generate an opposite delta signal such that a sum of the delta signal and the opposite delta signal are substantially zero at any instant of time. A cancelation unit is configured to apply the opposite delta signal across a second set of cells comprising one or more electrochemical cells of the plurality of electrochemical cells at least while the response signal is being measured, wherein the second set of cells is different from the first set of cells.

Embodiments of the present disclosure include an impedance measurement circuit, which includes a signal creator configured to generate a delta signal. An application unit is configured to apply the delta signal across at least one electrochemical cell of a plurality of electrochemical cells operably coupled together. An inverter unit is configured to generate an opposite delta signal such that a sum of the delta signal and the opposite delta signal are substantially zero at any instant of time. A plurality of cancelation circuits are included and each cancelation circuit is configured to apply a portion of the opposite delta signal across a corresponding electrochemical cell of the plurality of electrochemical cells. A measurement unit is configured to measure a response signal across the at least one electrochemical cell when the delta signal and the opposite delta signal are being applied.

Embodiments of the present disclosure include a method of measuring impedance. The method includes generating a delta signal and generating an opposite delta signal such that a sum of the delta signal and the opposite delta signal are substantially zero at any instant of time during an application period for the delta signal and the opposite delta signal. The delta signal is applied across a first set of cells comprising one or more electrochemical cells of a plurality of electrochemical cells operably coupled together. The opposite delta signal is applied across a second set of cells comprising one or more electrochemical cells of the plurality of electrochemical cells, wherein the second set of cells is different from the first set of cells. A current response signal is measured into the second set of cells when the delta signal and the opposite delta signal are being applied.

BRIEF DESCRIPTIONS OF THE DRAWINGS

FIG. 4 is a simplified diagram of an active measurement cancelation system using a multi-way system of measurement and cancelation.

FIGS. 5A-5C are tables showing some possible signal application scenarios for the active measurement cancelation system of FIG. 4.

DETAILED DESCRIPTION

Figure 1:
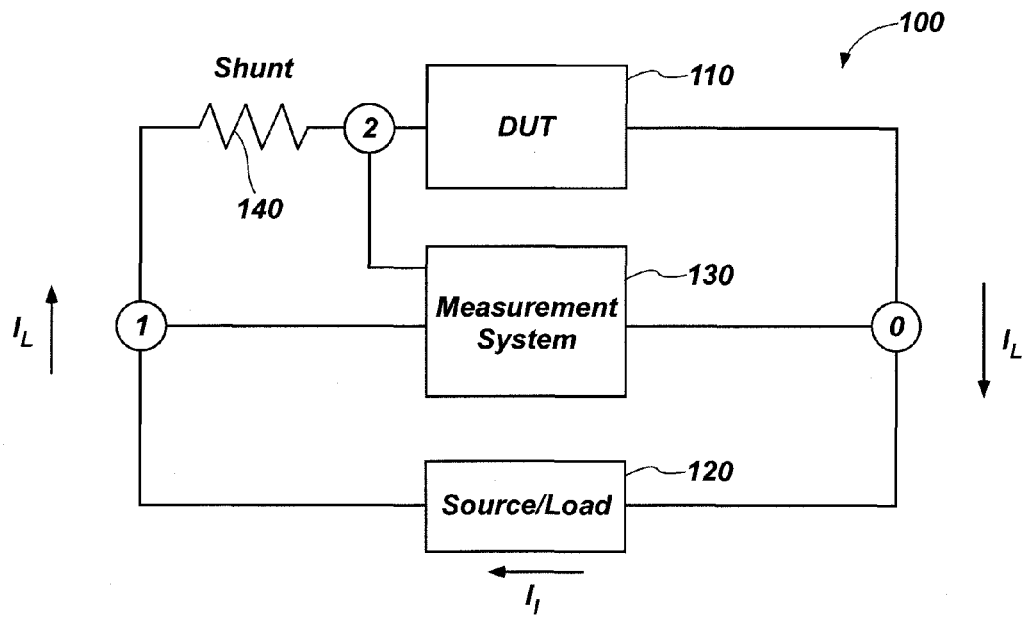
FIG. 1 is a simplified diagram of a conventional impedance measurement system.

In the following description, elements, circuits, and functions may be shown in block diagram form in order not to obscure the present invention in unnecessary detail. Conversely, specific implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Furthermore, in this description, reference is made to the accompanying drawings which form a part hereof, and in which is shown, by way of illustration, specific embodiments. The embodiments are intended to describe aspects of the invention in sufficient detail to enable those skilled in the art to practice the invention. Other embodiments may be utilized and changes may be made without departing from the scope of the present invention. The following detailed description is not to be taken in a limiting sense, and the scope of the present invention is defined only by the appended claims.

Those of skill in the art would understand that information and signals may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and may be implemented on any number of data signals including a single data signal.

Those of skill would further appreciate that the various illustrative logical blocks, modules, circuits, and algorithms as described in connection with embodiments disclosed herein may be implemented as electronic hardware, computer software, or combinations of both. To clearly illustrate this interchangeability of hardware and software, various illustrative components, blocks, modules, circuits, and steps are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments described herein.

The various illustrative logical blocks, modules, and circuits described in connection with the embodiments disclosed herein may be implemented or performed with a general purpose processor, a special purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In addition, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more instructions or code on a computer-readable medium. Computer-readable media includes both computer storage media and communication media including any medium that facilitates transfer of a computer program from one place to another.

Elements described herein may include multiple instances of the same element. These elements may be generically indicated by a numerical designator (e.g., 110) and specifically indicated by the numerical indicator followed by an alphabetic designator (e.g., 110A) or a numeric indicator preceded by a "dash" (e.g., 110-1). For ease of following the description, for the most part element number indicators begin with the number of the drawing on which the elements are introduced or most fully discussed. For example, where feasible, elements in FIG. 3 are designated with a format of 3xx, where 3 indicates FIG. 3 and xx designates the unique element.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or even at least 99% met.

For ease of description, electrochemical cells may be referred to herein as a battery and a battery may include one or more electrochemical cells.

Embodiments of the present disclosure provide an active measurement cancelation system that applies and cancels an active delta signal to determine impedance of a device under test.

Figure 2:
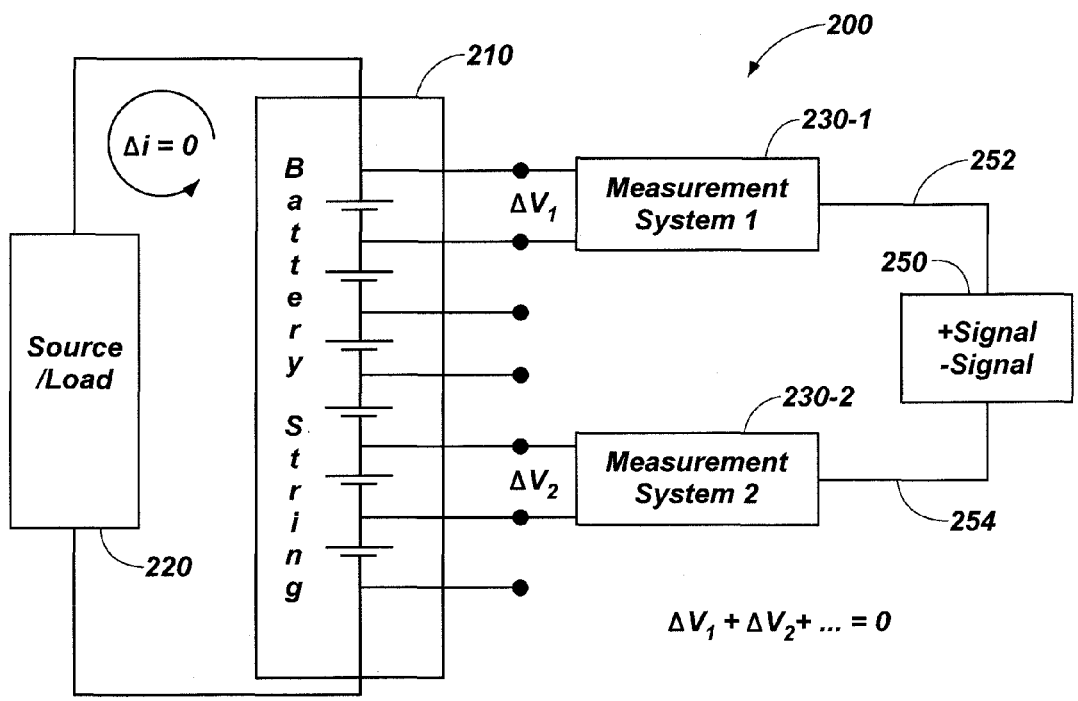
FIG. 2 is a simplified diagram of an active measurement cancelation system.

FIG. 2 is a simplified diagram of an active measurement cancelation system 200. The active measurement cancelation system 200 can be configured as an impedance measurement circuit for measuring various impedances in a string of electrochemical cells that make up a battery string 210, which is coupled to a source/load unit 220. A signal creator 250 generates a delta signal 252 and an opposite delta signal 254. The delta signal 252 feeds a first measurement system 230-1 and the opposite delta signal 254 feeds a second measurement system 230-2.

In order to simplify the logic involved with active measurement cancelation, the roles of signal and response are assigned as voltage driven signal and current response. This may be a reversed way of thinking but is equally valid to anyone skilled in the art. The first measurement system 230-1 transfers the delta signal $\Delta V_1$ from signal 252 across a first battery at the top of the battery string 210. The first measurement system 230-1 may also be configured to measure a $\Delta I_1$ current response across the first battery while the delta signal 252 is being applied to the first battery. Similarly, the second measurement system 230-2 transfers the opposite delta signal $\Delta V_2$ from signal 254 across a second battery at the second to bottom battery of the battery string 210. The second measurement system 230-2 may also be configured to measure a $\Delta I_2$ current response into the second battery while the opposite delta signal 254 is being applied to the second battery.

The voltage across the first battery while the delta signal 252 is being applied is equal to the original voltage across the first battery without the delta signal 252 plus the $\Delta V_1$ voltage. The voltage across the second battery while the opposite delta signal 254 is being applied is equal to the original voltage across the second battery without the opposite delta signal 254 plus the $\Delta V_2$ voltage. Moreover, the delta signal 252 and opposite delta signal 254 are configured such that a sum of the $\Delta V_1$ voltage across the first battery and the $\Delta V_2$ voltage across the second battery equals zero. As a result, while the source/load unit 220 will see a current related to whatever the operational states of the source/load unit 220 and the battery string 210 are, the source/load unit 220 will not see a $\Delta I$ due to the applied $\Delta V_1$ voltage and the applied $\Delta V_2$ voltage. In other words, an active signal is injected into one of the batteries for measurement purposes, but the active signal is canceled by injecting an equal and opposite signal into the other battery such that the overall $\Delta V$ seen by the source/load unit 220 due to injected signals is substantially zero. If $\Delta V$ at the source/load unit 220 is 0 then the $\Delta I$ response from the source/load unit 220 is also zero. The current responses due to the $\Delta V$ signal applied at 230-1 may or may not be equal to the current response due to the opposite $\Delta V$ signal applied at 230-2.

Another way to consider this active cancelation is that the first measurement system 230-1 "pins" the measurement current response due to the $\Delta V$ signal 252 within the two terminals of the first battery and the second measurement system 230-2 "pins" the measurement current response due to the opposite $\Delta V$ signal 254 within the two terminals of the second battery. As a result, components that are not coupled between the terminals of the measurement systems 230-1 and 230-2 in the combination of the battery string 210 and the source/load unit 220 will see no increase or decrease in current due to the injected signals. It is understood that the term between is relative and that both legs of the circuit can equally be considered to lie between the terminals. In general, the shortest leg will be visualized as lying between the terminals. It will become clear to one skilled in the art of circuit analysis that any circuitous mesh current delivered by the voltage signal generators, referred to as measurement systems 230-1 and 230-2, have been driven to 0 and that the response currents are now limited to an individual component and the voltage signal generator or measurement systems 230-1 and 230-2. It will become clear to one skilled in the art that the limiting minimal scale of this system is a system of at least three legs with three components between three nodes, two legs being spanned by a signal generator while the third leg has no signal generator. Moreover, it will become clear that all three legs can have a signal generator and that many more complex arrangements are possible.

The measurement systems 230-1 and 230-2 may also be referred to herein as measurement units 230-1 and 230-2. Moreover, and as explained in more detail with reference to FIGS. 9A-10B, the measurement units 230-1 and 230-2 may be configured with an application unit (may also be referred to herein as an application circuit) for applying the $\Delta V$ signal 252 or the opposite $\Delta V$ signal 254 and a measurement unit to measure the $\Delta I$ current into the battery to determine the impedance $Z=\Delta V \Delta/I$ of the battery. Thus, in some embodiments only one of the measurement units 230-1 and 230-2 need include the measurement unit to measure the $\Delta I$ current into the battery. As a non-limiting example, the first measurement unit 230-1 may include an application unit for applying the $\Delta V$ signal 252 to the first battery and a measurement unit for measuring the $\Delta I$ current into the first battery. The second measurement unit 230-2 may include only an application unit for applying the opposite $\Delta V$ signal 254 to the second battery. An application unit used just for applying either the $\Delta V$ signal 252 or the opposite $\Delta V$ signal 254 without performing any measurements may also be referred to herein as a cancelation unit or a cancelation circuit.

The system 200 shown in FIG. 2 illustrates a non-limiting example where each of the measurement units 230-1 and 230-2 is coupled across a single cell within the battery string 210. However, embodiments of the present disclosure are not so limited. Each of the measurement units 230-1 and 230-2 may be coupled across a set of cells. In other words, perhaps the first measurement unit 230-1 may be coupled across a first set of cells including the top two cells and the second measurement unit 230-2 may be coupled across a second set of cells including the bottom two cells. Thus, many embodiments may be used as long as the first set of cells and the second set of cells are different sets and the $\Delta V_1$ voltage and the $\Delta V_2$ voltage sum to substantially zero. Moreover, and as explained more fully below, the first set of cells and the second set of cells can partially overlap and there can be more than two measurement systems in the overall active measurement cancelation system.

In some embodiments, the $\Delta V_1$ signal 252 and the opposite $\Delta V_2$ signal 254 may be configured as DC signals applied over an application period. In other embodiments, the $\Delta V_1$ signal 252 and opposite $\Delta V_2$ signal 254 may be configured as time-varying signals applied over the application period. These time-varying signals may be as simple as a sine wave and cosine wave or may be as complex as desired as long as the $\Delta V_1$ signal 252 and the opposite $\Delta V_2$ signal 254 have a sum that is substantially zero at any instant of time along the time-varying signal.

Figure 3A:
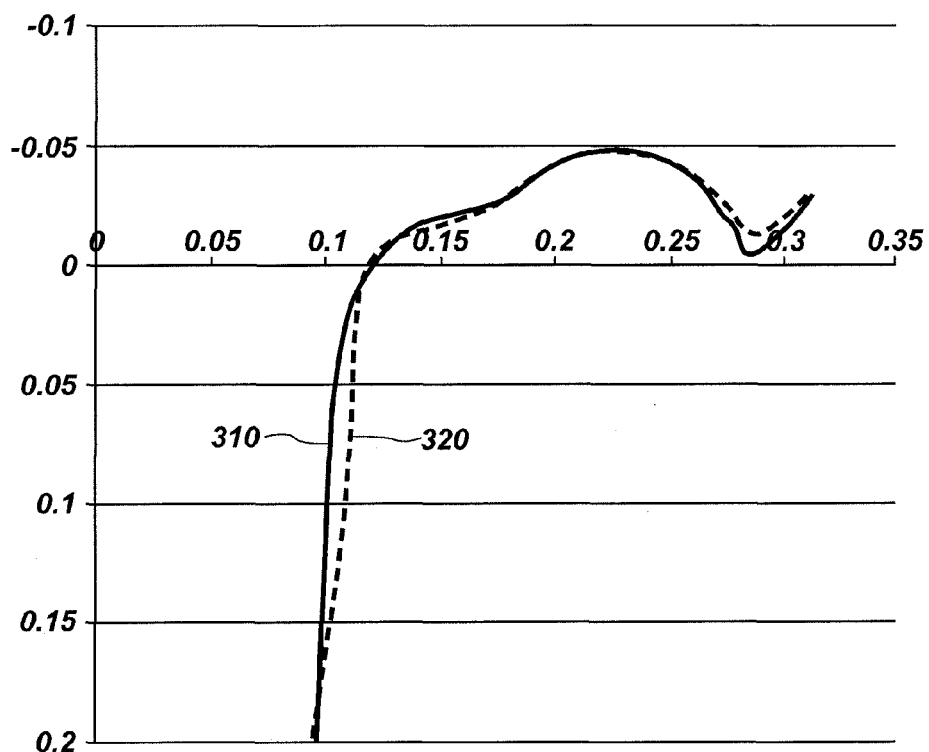
FIG. 3A is a Nyquist plot using an Electrochemical Impedance Spectroscopy (EIS) method of characterization and showing results of impedance measurements for an active measurement cancelation system and a conventional impedance measurement system.

FIG. 3A is a Nyquist plot using an Electrochemical Impedance Spectroscopy (EIS) method of characterization and showing results of impedance measurements for an active measurement cancelation system and a conventional impedance measurement system. Various parameters of a battery can be understood using complex impedance Nyquist curves. Nyquist curves plot the locus of impedance on the complex plane as the frequency goes from zero to infinity. Thus, the x-axis represents real impedance and the y-axis represents imaginary impedance with capacitive-type impedance at the top and inductive-type impedance on the bottom. The zero crossing of the x-axis is often referred to as the series resistance of a battery at higher frequencies. Nyquist representations of battery impedance are a format often used by electrochemical researchers in EIS analysis. Line 310 shows a Nyquist curve obtained using active measurement cancelation according to an embodiment of the present disclosure. Line 320 shows a Nyquist curve obtained from a conventional in-situ impedance measurement system. As can be seen, the results for the active measurement cancelation of line 310 closely matches the results of a conventional system of line 320.

Figure 3B:
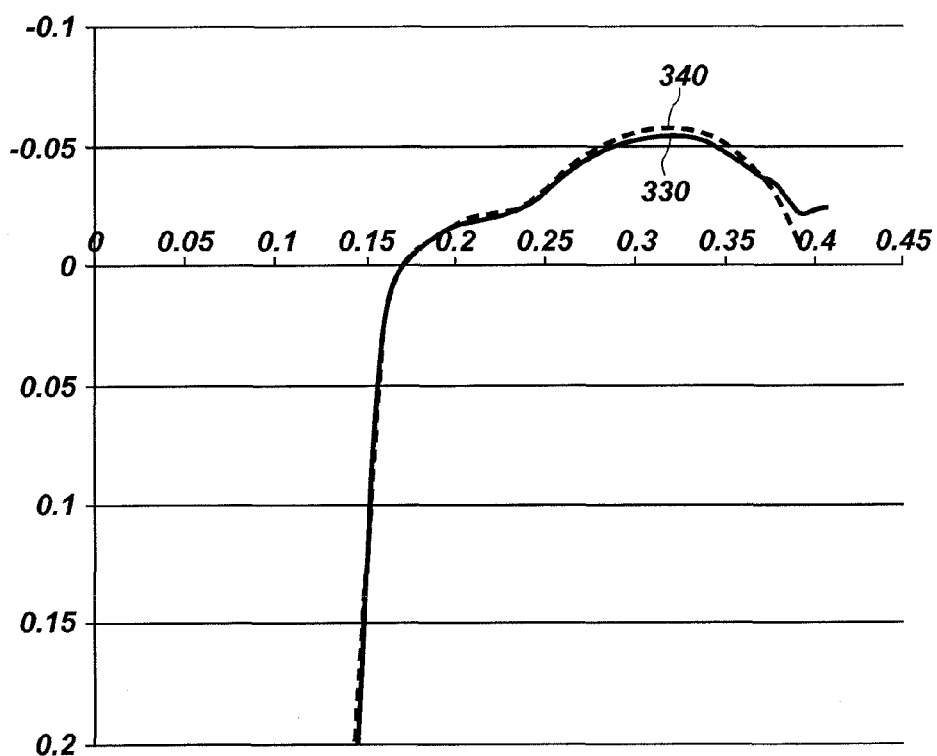
FIG. 3B is a Nyquist plot using an EIS method of characterization and showing results of impedance measurements for an active measurement cancelation system with and without a load.

FIG. 3B is a Nyquist plot using an EIS method of characterization and showing results of impedance measurements for an active measurement cancelation system with and without a load. Line 330 shows a Nyquist curve obtained using active measurement cancelation according to an embodiment of the present disclosure when the battery string is not loaded. Line 340 shows a Nyquist curve obtained using active measurement cancelation according to an embodiment of the present disclosure when the battery string is loaded. As can be seen, the results for the loaded condition of line 340 closely matches the results of the unloaded condition of line 330.

Figures 4, 5A:
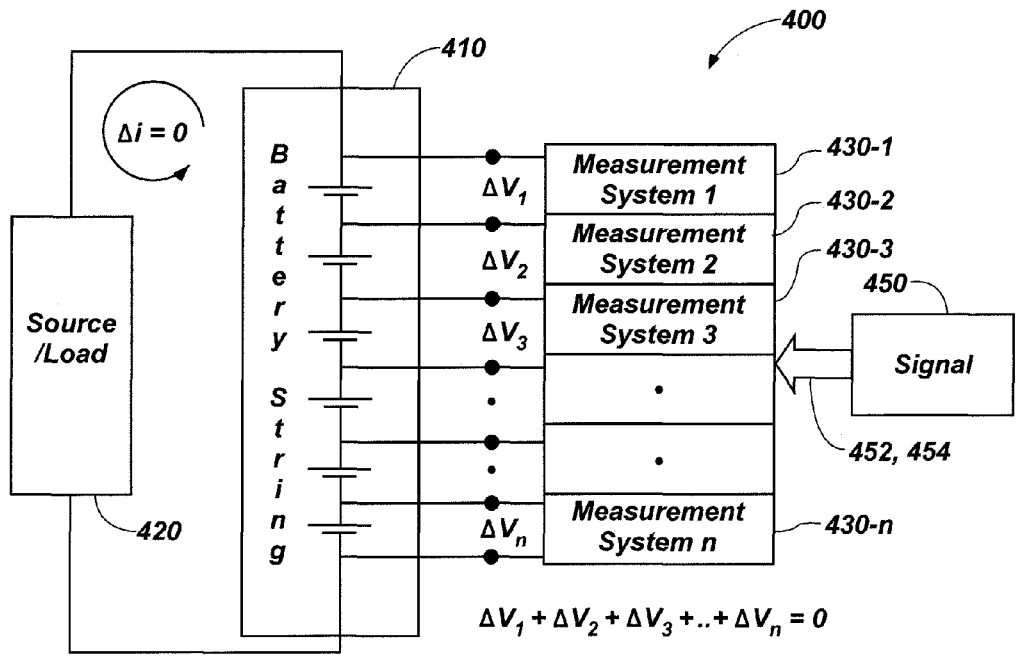

FIG. 4 is a simplified diagram of an active measurement cancelation system 400 using a multi-way system of measurement and cancelation. In a manner similar to that of FIG. 2, the active measurement cancelation system 400 of FIG. 4 may include a string of electrochemical cells that make up a battery string 410, which is coupled to a source/load unit 420. A signal creator 450 generates a delta signal 452 and an opposite delta signal 454. The delta signal 452 and opposite delta signal 454 may be used in a variety of ways by a set of measurement systems 430-1 through 430-$n$. The principals and operations are similar to those described above with reference to FIG. 2 and the overall active measurement and cancelation system will be able to measure impedance of one or more cells of the battery string 410 as long as all of the $\Delta V_1$ through $\Delta V_n$ voltages sum to substantially zero. In the configuration of FIG. 4, each of the measurement systems 430-1 through 430-$n$ may be configured with an application unit and a measurement unit.

FIGS. 5A-5C are tables showing some possible signal application scenarios for the active measurement cancelation system of FIG. 4. Referring to FIG. 4 and FIG. 5A the system is set up to have a "hard" delta signal 452 of about 0.05 Volts and a plurality of "soft" cancelation signals derived from the opposite delta signal 454. Thus, FIG. 5A shows a table for six active measurement units in six columns. Each row indicates a different time slice where a measurement is made for each battery coupled to one of the active measurement units. At time slice 1, a hard delta signal of 0.05 Volts is applied to a first battery and a soft opposite delta signal of −0.01 Volts is applied to each of the other five batteries. As can be seen, the sum of the delta signals for all six columns equals zero.

At time slice 2, the hard 0.05 Volts is applied by the second active measurement unit and the other five active measurement units apply a soft opposite delta signal of −0.01 Volts. Time slices 3-6 follow a similar pattern with the hard delta signal being applied by each successive active measurement unit. Some embodiments may use the larger hard signal for measuring the impedance of the battery receiving the hard delta signal while the other batteries are not measured and just receive the soft cancelation signals. However, any of the batteries may be measured in any of the various time slices.

FIG. 5B shows an alternate sequence for applying the hard delta signal and the soft cancelation signals. In this embodiment, the hard signals are applied as 0.15 Volts by different active measurement units at each of the time slices. However, the soft cancelation signals are configured to be different for each active measurement unit. At time slice 1, the second active measurement unit applies a cancelation signal of −0.01 Volts. The third active measurement unit applies a cancelation signal of −0.02 Volts. The fourth active measurement unit applies a cancelation signal of −0.03 Volts. The fifth active measurement unit applies a cancelation signal of −0.04 Volts. The sixth active measurement unit applies a cancelation signal of −0.05 Volts. However, the total of all the applied signals at any given time slice still sums to zero.

FIG. 5C shows a scenario similar to that of FIG. 5B except the hard delta signal is configured as a negative voltage and the soft cancelation signals are configured as positive voltages. A person of ordinary skill in the art will understand that many different combinations are possible. Moreover, some of the soft cancelation signals may be the same polarity as the hard signal as long as the sum of all the applied signals is zero.

Figure 6:
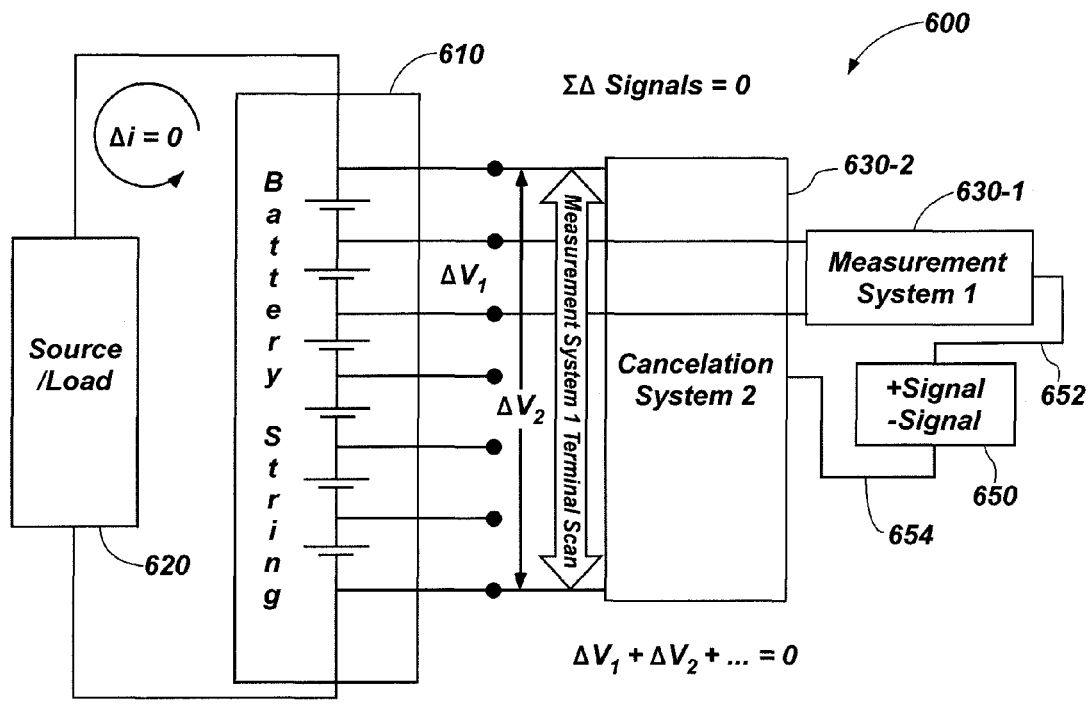
FIG. 6 is a simplified diagram of an active measurement cancelation system using a nested system of measurement and cancelation.

FIG. 6 is a simplified diagram of an active measurement cancelation system using a nested system of measurement and cancelation. In a manner similar to that of FIG. 2, an active measurement cancelation system 600 of FIG. 6 may include a string of electrochemical cells that make up a battery string 610, which is coupled to a source/load unit 620. A signal creator 650 generates a delta signal 652 and an opposite delta signal 654. The delta signal 652 feeds a measurement system 630-1 and the opposite delta signal 654 feeds a cancelation system 630-2.

In this system the cancelation system 630-2 (also referred to as a cancelation unit 630-2), is not configured to do any measuring and simply applies the cancelation signal responsive to the opposite delta signal 654. Moreover, the measurement system 630-1 is configured to drive the delta signal 652 across a single battery that is nested within the cancelation system 630-2, which is configured to drive the opposite delta signal 654 across all of the batteries in the battery string 610. In this manner, the cancelation system 630-2 can constantly apply the opposite delta signal 654 while the measurement system 630-1 is sequentially coupled to each battery in the battery string 610 to make a measurement of that battery while it is driving the delta signal 652 to that battery.

Other more complex nested systems may also be used such as two measurement systems 630-1 each separately nested within the cancelation system 630-2. In another non-limiting example, a first measurement system 630-1 may be nested within a second measurement system 630-1, which is nested within the cancelation system 630-2. The active measurement cancelation system 600 allows accurate "pinned" measurement of the individual cells within the battery string 610; however, the nested configuration exposes the source/load to ΔV and ΔI current. This exposure is because the source/load unit 620 lies between the terminals of the cancelation system 630-2. If the source/load unit 620 is sensitive to ΔV and ΔI current, then other non-nested systems may be appropriate. It will become clear to one skilled in the art that regions where no disturbance occurs can be shifted by earful placement of system components.

Figure 7:
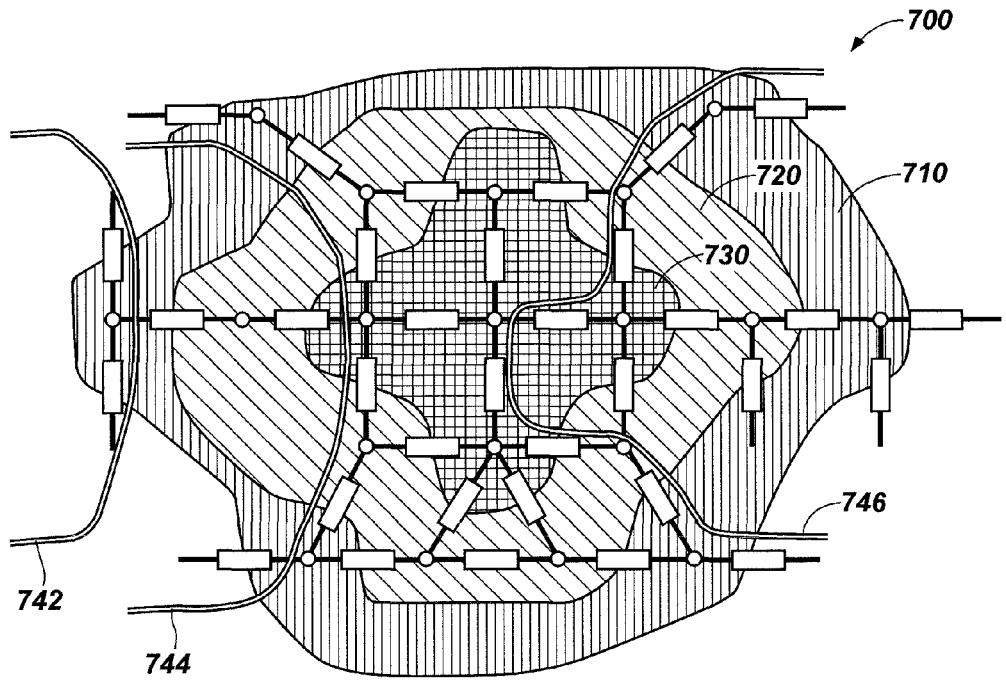
FIG. 7 is a network diagram showing a general application of active measurement cancelation.

FIG. 7 is a network diagram showing a general application of active measurement cancelation. While the discussion herein focuses on impedance measurements of batteries coupled in series, embodiments of the present disclosure are not so limited. The method of applying a set of signals that sum to zero across a system may be applied to a complex network of electrical components to measure the impedance of individual components or combinations of components.

In FIG. 7, the rectangular boxes represent components coupled together in a network with junctions shown as small circles. Lines 742, 744, and 746 represent paths that may be measured across the network. Shaded area 710 may be thought of as a first plateau 710 such that all the nodes within the first plateau 710 are at a first applied delta voltage. Shaded area 720 may be thought of as a second plateau 720 such that all the nodes within the second plateau 720 are at a second applied delta voltage. Shaded area 730 may be thought of as a third plateau 730 such that all the nodes within the third plateau 730 are at a third applied delta voltage.

To realize this configuration, a system 700 such as the first measurement system 630-1 would be positioned across the terminals of any component straddling two plateaus. The active cancelation and measurement will work for any paths as long as the paths traverse "up" through a gradient of plateaus and back "down" through a gradient of plateaus such that the sum of the traversal is zero. For example, line 742 enters the network and traverses up to the first plateau 710 then back down as it exits the network. As other examples, lines 744 and 746 enter the network and traverse up to the first plateau 710, up to the second plateau 720, up to the third plateau 730, down to the second plateau 720, down to the first plateau 710, then exit the network. All gradients portrayed in the system 700 are understood to be ΔV gradients imposed on preexisting voltage levels.

Figure 8:
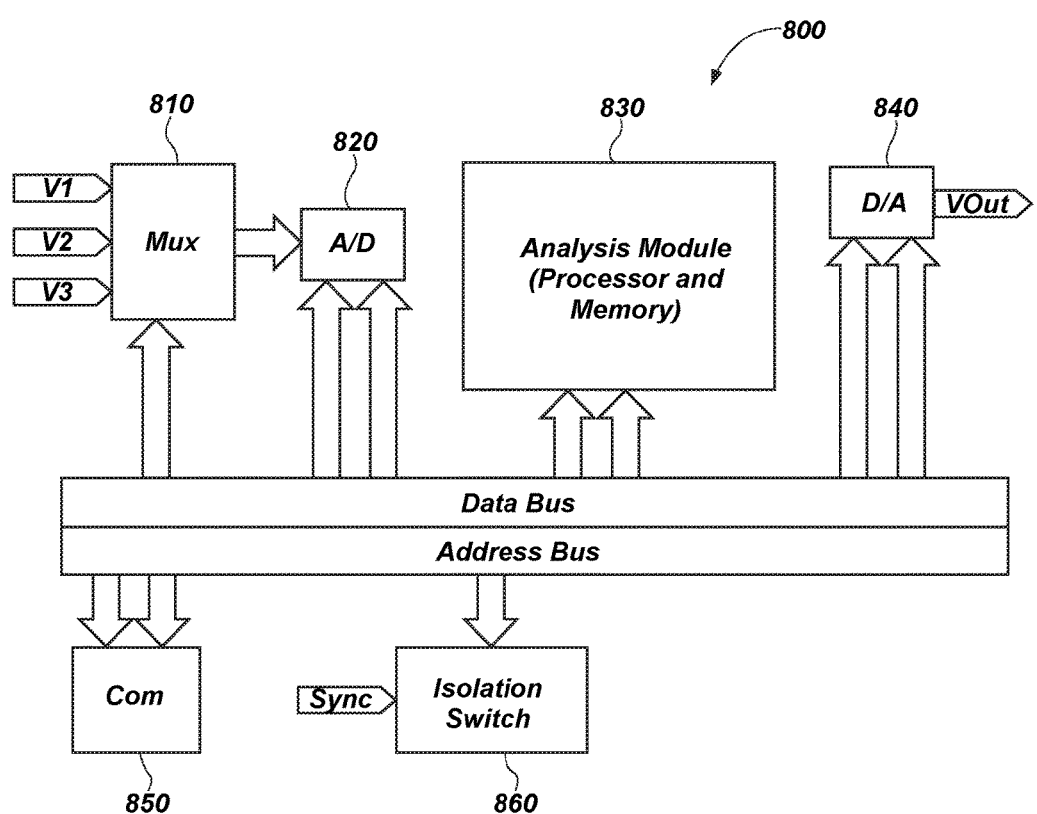
FIG. 8 is a simplified block diagram of an evaluation module that may be used in some embodiments of the present disclosure.
Figure 9A:
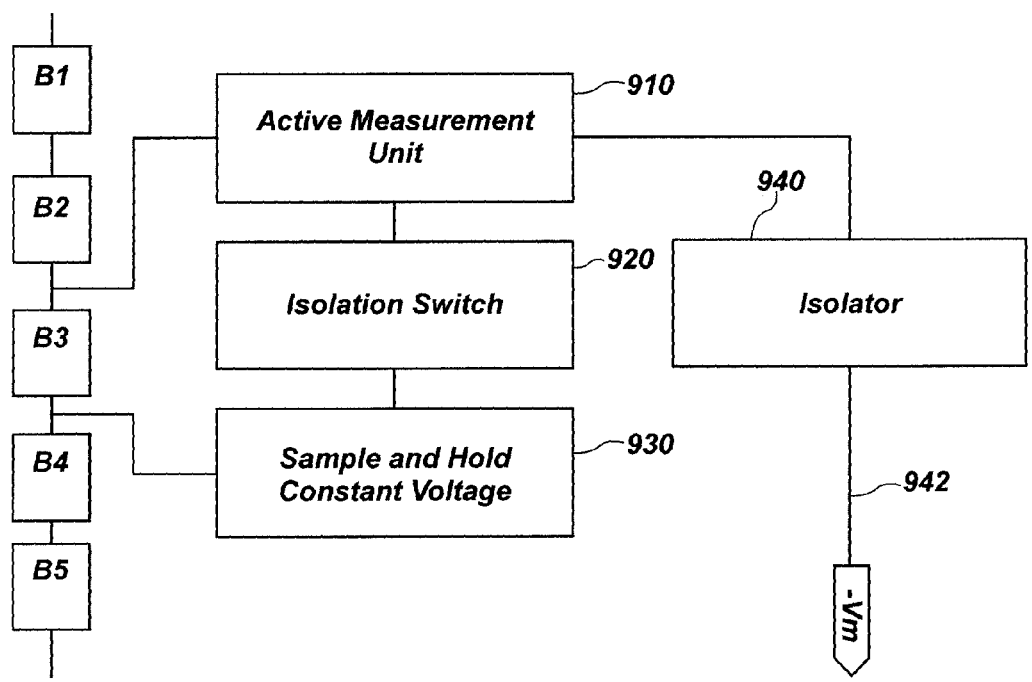
FIGS. 9A and 9B are simplified block diagrams showing details of application and cancelation of delta signals to batteries.

FIG. 8 is a simplified block diagram of a system 800 with a sample and hold unit 930 (e.g., see FIG. 9A). FIG. 9A in turn represents one measurement system such as the first measurement system 630-1 in FIG. 6. The system 800 includes an analysis module 830 that may be used in some embodiments of the present disclosure. Many evaluation systems 800 may be used in embodiments of the present disclosure and FIG. 8 is merely an example of one such embodiment for purposes of discussion. A multiplexer 810 may be included for selecting various signals from various locations within the first measurement system 630-1. The multiplexer 810 may feed an analog-to-digital converter 820. The analog-to-digital converter 820 may be coupled to the analysis module 830 through an address bus, data bus, a combination thereof, or other suitable communication mechanisms. A digital-to-analog converter 840 may be included for generating an analog output from a digital signal supplied by the analysis module 830 through the data bus, address bus, or other suitable communication mechanism. The analog output in the system 800 serves as the sample and hold constant voltage 930 as depicted in FIG. 9A. One or more isolation switches 860 may be controlled by the analysis module 830 as explained below.

A communication module 850 may be included for communicating with various measurement systems as well as with other computers through a suitable communication port or network. By way of example, and not limitation, the communication module 850 may include elements for communicating on wired and wireless communication media such as, for example, serial ports, parallel ports, Ethernet connections, universal serial bus (USB) connections IEEE 1394 ("firewire") connections, BLUETOOTH® wireless connections, 802.1 a/b/g/n type wireless connections, and other suitable communication interfaces and protocols.

The analysis module 830 may be a computing system configured for executing software programs containing computing instructions and includes one or more processors, memory, and storage. The one or more processors may be configured for executing a wide variety of operating systems and applications including the computing instructions for carrying out embodiments described herein.

The memory may be used to hold computing instructions, data, and other information for performing a wide variety of tasks including performing embodiments described herein. By way of example, and not limitation, the memory may include Synchronous Random Access Memory (SRAM), Dynamic RAM (DRAM), Read-Only Memory (ROM), Flash memory, and the like.

The storage 830 may be used for storing large amounts of non-volatile information for use in the evaluation system 800 and may be configured as one or more storage devices. By way of example, and not limitation, these storage devices may be, but are not limited to, magnetic and optical storage devices such as disk drives, Flash memory, magnetic tapes, CDs (compact discs), DVDs (digital versatile discs or digital video discs), and other equivalent storage devices.

When executed as firmware or software, the instructions for performing the processes described herein may be stored on a computer-readable medium. A computer-readable medium includes, but is not limited to, magnetic and optical storage devices such as disk drives, magnetic tape, CDs (compact discs), DVDs (digital versatile discs or digital video discs), and semiconductor devices such as RAM, DRAM, ROM, EPROM, and Flash memory.

By way of non-limiting example, computing instructions for performing the processes may be held on the storage, transferred to the memory for execution, and executed by the processor. The processor, when executing computing instructions configured for performing the processes, constitutes structure for performing the processes and may be considered a special purpose computer when executing the computing instructions. In addition, some or all portions of the processes may be performed by hardware specifically configured for carrying out the processes.

Figure 9B:
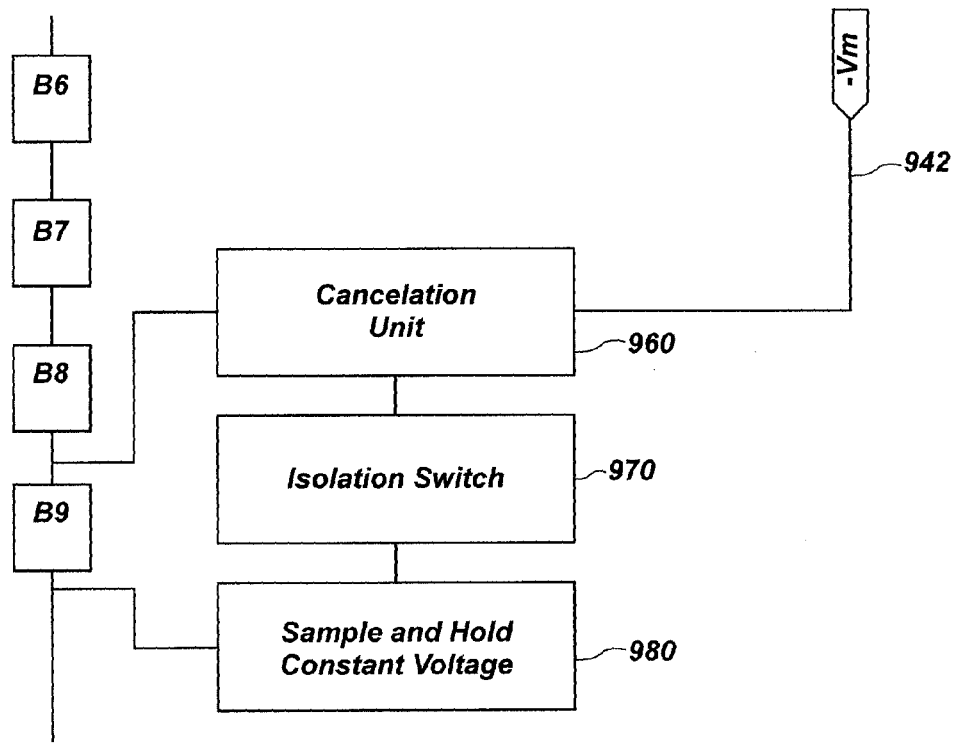

FIGS. 9A and 9B are simplified block diagrams showing details of application and cancelation of delta signals to batteries B1-B9. A sample and hold unit 930 may be configured to sample a voltage across battery B3 when a delta signal is not being applied to battery B3 as defined by an isolation switch 920. An active measurement unit 910 may be configured to define and apply a delta signal to battery B3 at a predefined time and voltage that adds to the voltage from the sample and hold unit 930. The active measurement unit 910 may also be configured to measure the voltage across battery B3 while the delta signal is being applied and the associated delta current response needed to determine the impedance of battery B3. An isolator 940 may be included to take the delta voltage defined by the active measurement unit 910, isolate it from the ground reference of battery B3, invert it to generate $-V_m$ and re-reference it to the new ground reference of B9 as an opposite delta signal 942. The isolator 940 may also be referred to herein as an inverter unit 940.

In FIG. 9B, a sample and hold unit 980 may be configured to sample a voltage across battery B9 when an opposite delta signal 942 is not being applied to battery B9 as defined by an isolation switch 970. A cancelation unit 960 may be configured to apply the opposite delta signal 942 to battery B9 at a predefined time, subtracting the delta voltage from the voltage of the sample and hold unit 980 and applying the resulting voltage level across the terminals of battery B9.

Figure 10A:
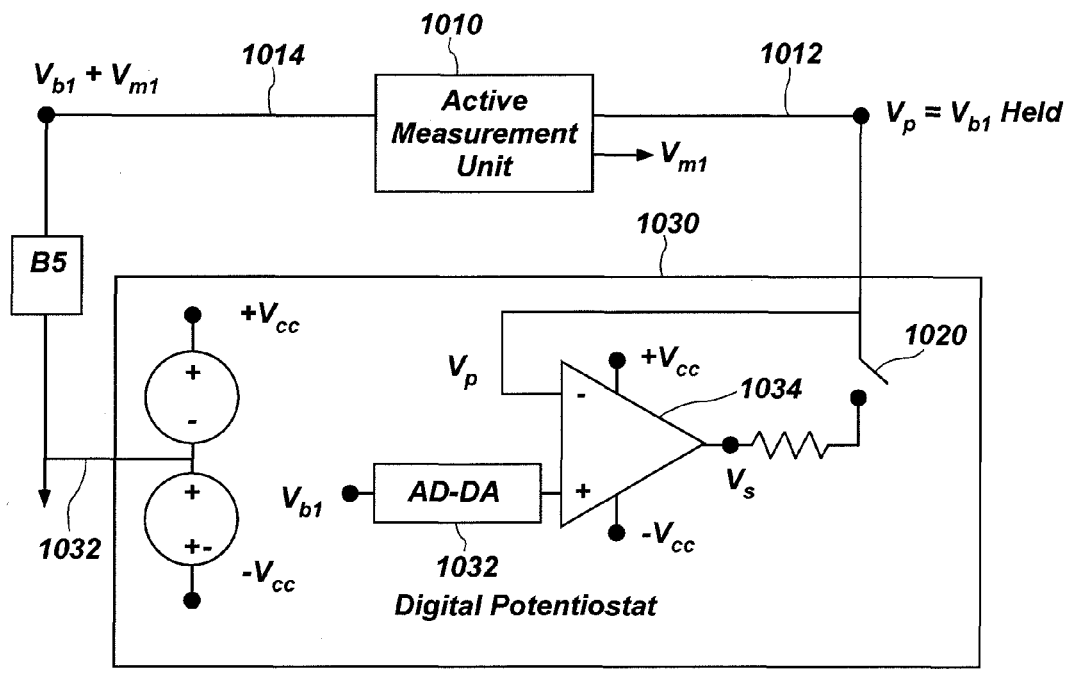
FIGS. 10A and 10B show additional detail for some elements of the block diagrams of FIGS. 9A and 9B.
Figure 10B:
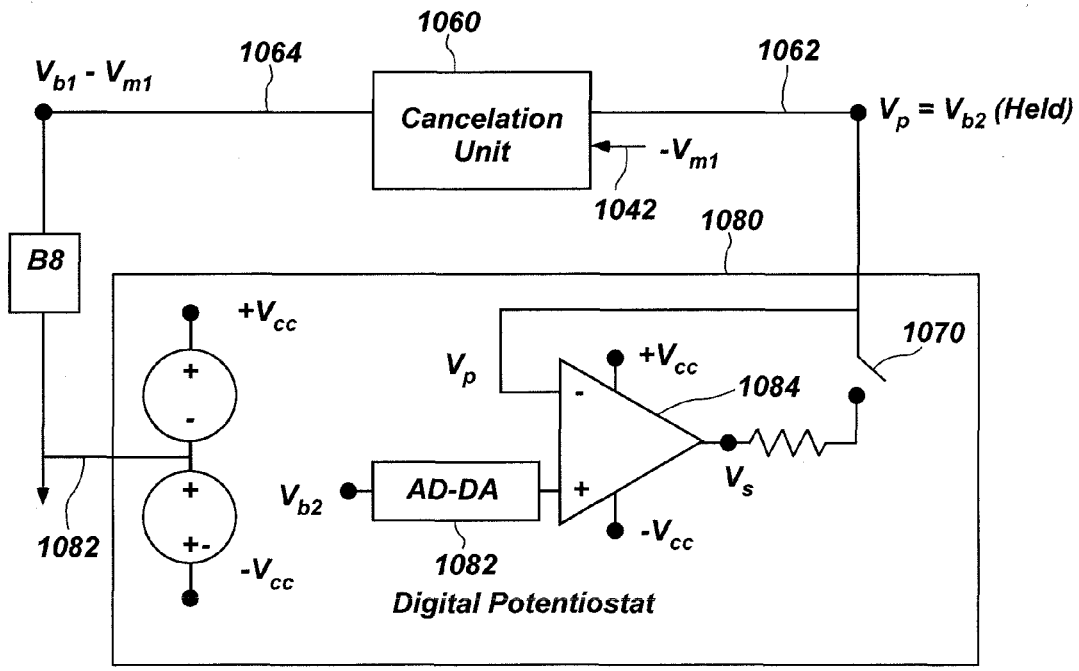

FIGS. 10A and 10B show additional detail for some elements of the block diagrams of FIGS. 9A and 9B. In FIG. 10A a first digital potentiostat 1030 performs the sample and hold function of block 930 in FIG. 9A. In FIG. 10B a second digital potentiostat 1080 performs the sample and hold function of block 980 in FIG. 9B.

Node b1 is defined at element 1014 and node b2 is defined at element 1064. Node b1 feeds a first AD-DA converter 1032 and node b2 feeds a second AD-DA converter 1082. While not illustrated, the first AD-DA converter 1032 and the second AD-DA converter 1082 may intermediately send the digital data to the analysis module 830, such as in FIG. 8. Thus, and referring to FIG. 8, the AD-DA converters 1032 and 1082 may be implemented as the A/D converter 820, the analysis module 830, and the D/A converter 840 in FIG. 8.

Thus, node b1 may be selected to drive the A/D converter 820; the digital data may be stored in the analysis module 830 and may be further processed by the analysis module 830. The digital data representing the voltage at node b1 is then fed to the D/A converter 840, which is configured to drive amplifier 1034.

Similarly, node b2 may be selected to drive the A/D converter 820; the digital data may be stored in the analysis module 830 and may be further processed by the analysis module 830. The digital data representing the voltage at node b2 is then fed to the D/A converter 840, which is configured to drive amplifier 1084.

Amplifier 1034 is configured as a voltage-follower such that when isolation switch 1020 is closed, node 1012 (Vp) will be at the same potential as the +input to the amplifier 1034, which is at the same voltage as node b1. Similarly, amplifier 1084 is configured as a voltage-follower such that when isolation switch 1070 is closed, node 1062 (Vp) will be at the same potential as the +input to the amplifier 1084, which is at the same voltage as node b2. Thus, when delta signals are not being applied and isolation switches 1020 and 1070 are closed, node 1012 will have the same potential as node b1, which is the voltage across battery B5 during a normal operational state and node 1062 will have the same potential as node b2, which is the voltage across battery B8 during a normal operational state.

The isolation switches 1020 and 1070 may then be closed and the voltages that were across batteries B5 and B8 will be held at nodes 1012 and 1062, respectively.

An active measurement unit 1010 may be any conventional measurement system used in battery impedance measurements, such as, for example, an EIS measurement unit. The active measurement unit 1010 uses the held voltage on node 1012 as a reference and adds the internally generated delta signal to the potential of node 1012 to drive node 1014 with a voltage of Vp+Vm1, where Vp is the held Vb1 voltage and Vm1 is the voltage of the delta signal. Vm1 drives the isolator 940 (FIG. 9A) to generate −Vm1 as an opposite delta signal 1042, which is input to a cancelation unit 1060.

The cancelation unit 1060 uses the held voltage on node 1062 as a reference and adds the opposite delta signal −Vm1 to the potential of node 1062 to drive node 1064 with a voltage of Vp−Vm1 where Vp is the held Vb2 voltage and −Vm1 is the voltage of the opposite delta signal 1042. As a result, during an application period when the delta signal is being applied to battery B5 and the opposite delta signal 1042 is being applied to battery B8, the voltages sum as Vb1+Vm1+Vb2−Vm1, which translates to Vb1+Vb2 showing that the applied delta signal and applied opposite delta signal 1042 have canceled each other out.

Figure 11:
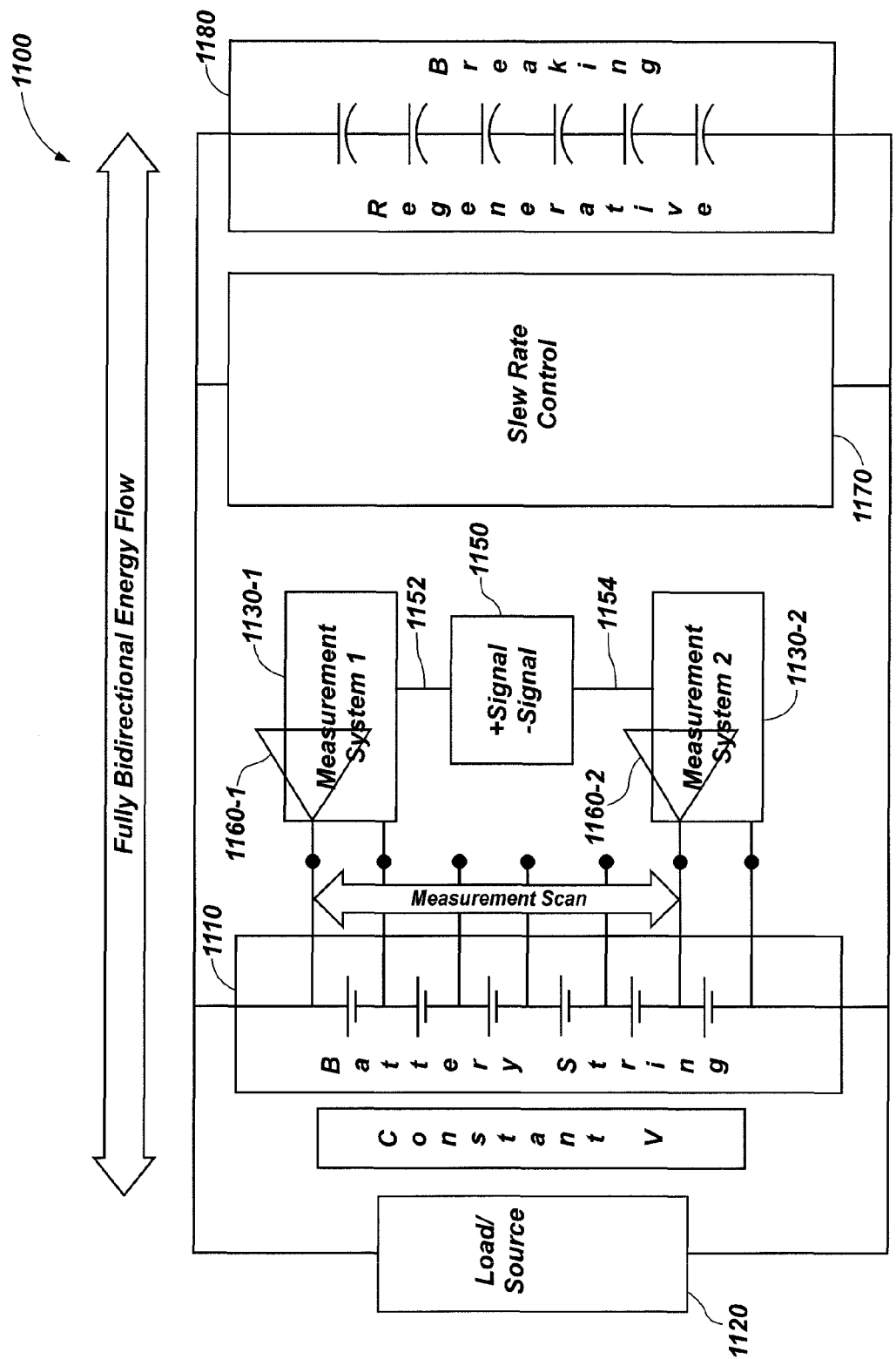
FIG. 11 is a simplified diagram of an active measurement cancelation system using a nested system of measurement and cancelation and including a slew rate control.

FIG. 11 is a simplified diagram of an active measurement cancelation system 1100 including a slew rate control. High energy charge and discharge pulses on a battery may degrade storage capacity and energy delivery characteristics of the battery. In addition, degradation is particularly pronounced when the charge and discharge pulses have very fast rise and fall times. Slew rate control can limit these fast rise and fall times and, as a result, reduce degradation of the batteries. Additional details for slew rate control may be found in U.S. patent application Ser. No. 13/673,065, now U.S. Pat. No. 9,312,577, issued Apr. 12, 2016 and entitled, "Circuits and Methods for Determination and Control of Signal Transition Rates in Electrochemical Cells," the content of which is hereby incorporated herein in its entirety. It is understood that a third function may be needed within a system 1100 to acquire accurate measurements of the individual battery components. In the event that a change to a source/load unit 1120 occurs during a measurement event, measurements by a measurement system 1130-1 and a cancelation system 1130-2 would be disrupted. To prevent this from happening, a slew rate control system 1170 would have the dual function of holding the terminal voltages constant during the short time span required for a measurement event to occur. A system capable of performing such short time span high energy feat can serve the secondary function of slew rate control.

FIG. 11 is similar to FIG. 6 except that a regenerative braking unit 1180 is included as a source for charging a battery string 1110. As with FIG. 6, FIG. 11 also includes the string of electrochemical cells that make up the battery string 1110, which is coupled to a source/load unit 1120. A signal creator 1150 generates a delta signal 1152 and an opposite delta signal 1154. The delta signal 1152 feeds a measurement system 1130-1 and the opposite delta signal 1154 feeds a cancelation system 1130-2. The cancelation system 1130-2, the measurement system 1130-1, or both may also include a transition modifying circuit (1160-2, 1160-1, respectively) for generating the slew rate control. Operation of the active measurement cancelation is the same as described above for FIG. 2.

As a non-limiting example, if the cancelation system 1130-2 includes the transition modifying circuit 1160-2, it can act as a watchdog for slew rate limiting across the battery string 1110.

Figure 12:
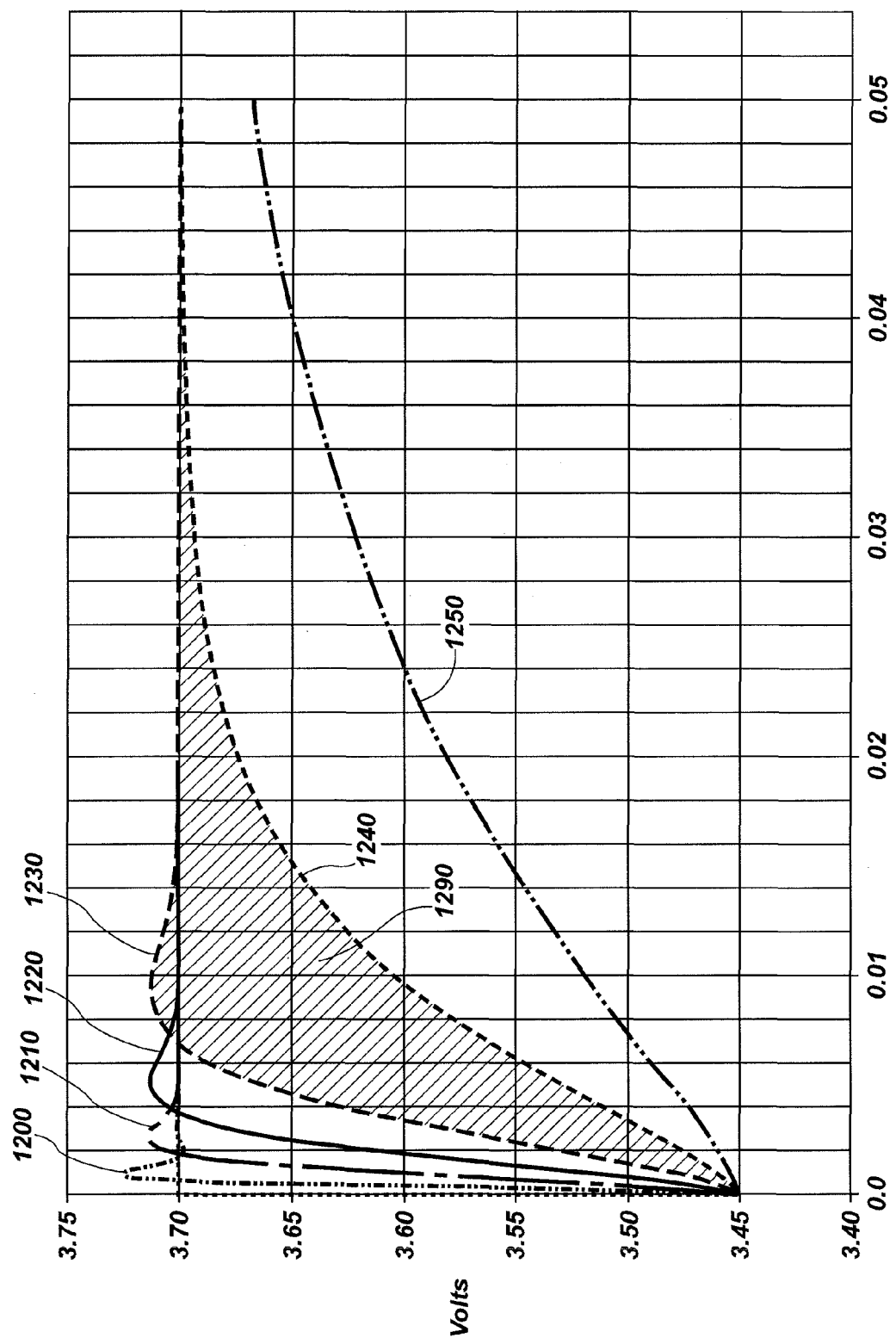
FIG. 12 is a graph of a slew rate control.

FIG. 12 is a graph of a slew rate control showing various responses of a transition modifying circuit 1160 (see FIG 11) to an instantaneous rising edge and illustrating a region of interest 1290 where degradation of the battery is reduced. As non-limiting examples for the various curves, curve 1200 illustrates the applied transition rate to the battery 100 when there is no transition modifying circuit 1160. Curve 1210 illustrates the applied transition rate to the battery 100 using a 33 uH inductor L1 and a 3.3 mF capacitor C1 for the transition modifying circuit 1160. Curve 1220 illustrates the applied transition rate to the battery 100 using a 47 uH inductor L1 and a 10 mF capacitor C1 for the transition modifying circuit 1160. Curve 1230 illustrates the applied transition rate to the battery 100 using a 100 uH inductor L1 and an 18 mF capacitor C1 for the transition modifying circuit 1160. Curve 1240 illustrates the applied transition rate to the battery 100 using a 200 uH inductor L1 and a 68 mF capacitor C1 for the transition modifying circuit 1160. Curve 1250 illustrates the applied transition rate to the battery 100 using a 200 uH inductor L1 and a 136 mF capacitor C1 for the transition modifying circuit 1160.

The region of interest 1290 illustrates a region where the applied transition rate creates reduced degradation of charge capacity characteristics for the battery, while still using cost effective components and not unduly reducing power that may be delivered to the battery. For example, to the left of the region of interest 1290 the faster slew rates cause increased degradation to charge capacity characteristics for the battery. To the right of the region of interest 1290 the slower slew rates require larger, more expensive components and have little additional effect on battery degradation.

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed, including legal equivalents. In addition, features from one embodiment may be combined with features of another embodiment while still being encompassed within the scope of the disclosure.

What is claimed is:

1. An impedance measurement circuit, comprising:
   a signal creator configured to generate a delta signal and an opposite delta signal, which is substantially equal and opposite in amplitude to the delta signal, such that a sum of the delta signal and the opposite delta signal is substantially zero at any instant of time;
   a first application circuit configured to apply the delta signal across a first set of cells comprising one or more electrochemical cells of a plurality of electrochemical cells, wherein the plurality of electrochemical cells are operably coupled in series between a first end terminal and a second end terminal;
   a second application circuit configured to apply the opposite delta signal while the delta signal is being applied and across a second set of cells comprising one or more electrochemical cells of the plurality of electrochemical cells; and
   a measurement unit configured to measure a response signal across the second set of cells when the delta signal and the opposite delta signal are being applied;
   wherein the second set of cells is different from the first set of cells and there is substantially no change in current between the first end terminal and the second end terminal due to the application of the delta signal and the opposite delta signal.

2. The impedance measurement circuit of claim 1, wherein the measurement unit is further configured to measure a held voltage across the second set of cells when the delta signal and the opposite delta signal are not being applied and further comprising an analysis module configured for analyzing the response signal relative to the held voltage to determine an impedance of the second set of cells.

3. The impedance measurement circuit of claim 1, wherein:
   the first set of cells comprises a first cell of the plurality of electrochemical cells; and
   the second set of cells comprises a second cell of the plurality of electrochemical cells that is different from the first cell.

4. The impedance measurement circuit of claim 3, wherein the first application circuit and the measurement unit are operably coupled to form an active measurement unit, and the active measurement unit is configured to be selectively coupled to each of the plurality of electrochemical cells as the first cell.

5. The impedance measurement circuit of claim 3, wherein the second application circuit is configured to be selectively coupled to each of the plurality of electrochemical cells as the second cell.

6. The impedance measurement circuit of claim 1, wherein:
the second set of cells comprises all of the plurality of electrochemical cells; and
the first set of cells comprises fewer than all of the plurality of electrochemical cells.

7. The impedance measurement circuit of claim 6, wherein the first set of cells comprises a single electrochemical cell of the plurality of electrochemical cells.

8. The impedance measurement circuit of claim 7, wherein the first application circuit and the measurement unit are operably coupled to form an active measurement unit and the active measurement unit is configured to be selectively coupled to each of the plurality of electrochemical cells as the first set of cells.

9. The impedance measurement circuit of claim 1, further comprising:
a source/load unit for respectively supplying charge pulses and discharge pulses to the plurality of electrochemical cells, wherein the charge pulses and discharge pulses include a transition rate; and
wherein the first application circuit includes a transition modifying circuit operably coupled between the source/load unit and a terminal of the plurality of electrochemical cells, the transition modifying circuit comprising at least one circuit element configured to generate an adjusted transition rate on the terminal that is slower than the transition rate and sufficient to reduce degradation of one or more charge capacity characteristics of the plurality of electrochemical cells.

10. An impedance measurement circuit, comprising:
an active measurement unit configured to:
generate a delta signal;
apply the delta signal across a first set of cells comprising one or more electrochemical cells of a plurality of electrochemical cells; wherein the plurality of electrochemical cells are operably couples in series between a first end terminal and a second end terminal; and
measure a response signal across the first set of cells when the delta signal is being applied;
an inverter unit configured to generate an opposite delta signal which is substantially equal and opposite in amplitude to the delta signal, such that a sum of the delta signal and the opposite delta signal is substantially zero at any instant of time; and
a cancelation unit configured to apply the opposite delta signal while the delta signal is being applied and across a second set of cells comprising one or more electrochemical cells of the plurality of electrochemical cells;
wherein the second set of cells is different from the first set of cells and there is substantially no change in current between the first end terminal and the second end terminal due to the application of the delta signal and the opposite delta signal.

11. The impedance measurement circuit of claim 10, wherein the active measurement unit is further configured to measure a held voltage across the first set of cells when the delta signal and the opposite delta signal are not being applied and further comprising an analysis module configured for analyzing the response signal as a current when the delta signal is applied to determine an impedance of the first set of cells.

12. The impedance measurement circuit of claim 10, wherein:
the first set of cells comprises a first cell of the plurality of electrochemical cells; and
the second set of cells comprises a second cell of the plurality of electrochemical cells that is different from the first cell.

13. The impedance measurement circuit of claim 10, wherein the active measurement unit is configured to be selectively coupled to each of the plurality of electrochemical cells as the first set of cells.

14. The impedance measurement circuit of claim 10, wherein the cancelation unit is configured to be selectively coupled to each of the plurality of electrochemical cells as the second set of cells.

15. The impedance measurement circuit of claim 10, wherein:
the second set of cells comprises all of the plurality of electrochemical cells; and
the first set of cells comprises fewer than all of the plurality of electrochemical cells.

16. The impedance measurement circuit of claim 15, wherein the active measurement unit is configured to be selectively coupled to each of the plurality of electrochemical cells as the first set of cells.

17. An impedance measurement circuit, comprising:
a signal creator configured to generate a delta signal;
an application unit configured to apply the delta signal across at least one electrochemical cell of a plurality of electrochemical cells wherein the plurality of electrochemical cells are operably coupled in series between a first end terminal and a second end terminal;
an inverter unit configured to generate an opposite delta signal, which is substantially equal and opposite in amplitude to the delta signal, such that a sum of the delta signal and the opposite delta signal is substantially zero at any instant of time;
a plurality of cancelation circuits, each cancelation circuit configured to apply a portion of the opposite delta signal across a corresponding electrochemical cell of the plurality of electrochemical cells while the delta signal is being and such that there is substantially no change in current between the first end terminal and the second end terminal due to the application of the delta signal and the opposite delta signal; and
a measurement unit configured to measure a response signal across the at least one electrochemical cell when the delta signal and the opposite delta signal are being applied.

18. The impedance measurement circuit of claim 17, wherein the measurement unit is further configured to measure a held voltage across the at least one electrochemical cell when the delta signal and the opposite delta signal are not being applied and further comprising an analysis module configured for analyzing the response signal as a current relative to the held voltage to determine an impedance of the at least one electrochemical cell.

19. The impedance measurement circuit of claim 17, wherein:
the signal creator, the application unit, and the measurement unit are operably coupled to form an active measurement unit and the active measurement unit is configured to be selectively coupled to each of the plurality of electrochemical cells as the at least one electrochemical cell; and each cancelation circuit of the plurality of cancelation circuits is configured to apply a portion of the delta signal across a corresponding electrochemical cell, wherein the corresponding electrochemical cells comprise all the electrochemical cells in the plurality except the at least one electrochemical cell.

20. The impedance measurement circuit of claim 19, wherein the portion of the delta signal is substantially equal for each cancelation circuit of the plurality of cancelation circuits.

21. The impedance measurement circuit of claim 19, wherein the portion of the delta signal is different for each cancelation circuit of the plurality of cancelation circuits.

22. A method of measuring impedance, comprising:
generating a delta signal;
generating an opposite delta signal, which is substantially equal and opposite in amplitude to the delta signal, such that a sum of the delta signal and the opposite delta signal is substantially zero at any instant of time during an application period for the delta signal and the opposite delta signal;
applying the delta signal across a first set of cells comprising one or more electrochemical cells of a plurality of electrochemical cells, wherein the plurality of electrochemical cells are operably coupled in series between a first end terminal and a second end terminal;
applying the opposite delta signal across a second set of cells comprising one or more electrochemical cells of the plurality of electrochemical cells, wherein the second set of cells is different from the first set of cells and such that there is substantially no change in current between the first end terminal and the second end terminal due to the application of the delta signal and the opposite delta signal; and
measuring a current response signal into the second set of cells when the delta signal and the opposite delta signal are being applied.

23. The method of claim 22, wherein:
applying the delta signal across the first set of cells comprises applying the delta signal across a first cell of the plurality of electrochemical cells; and
applying the opposite delta signal across the second set of cells comprises applying the opposite delta signal across a second cell of the plurality of electrochemical cells that is different from the first cell.

24. The method of claim 23, wherein generating the delta signal, applying the delta signal, and measuring the response signal are performed by an active measurement unit and further comprising sequentially and selectively coupling the active measurement unit to each of the plurality of electrochemical cells as the first cell.

25. The method of claim 23, wherein applying the opposite delta signal comprises sequentially and selectively applying the opposite delta signal to each of the plurality of electrochemical cells as the second cell.

26. The method of claim 22, wherein:
applying the opposite delta signal across the second set of cells comprises applying the opposite delta signal across all of the plurality of electrochemical cells; and
applying the delta signal across the first set of cells comprises applying the delta signal across fewer than all of the plurality of electrochemical cells.

27. The method of claim 26, wherein applying the delta signal across the first set of cells comprises applying the delta signal across a single electrochemical cell of the plurality of electrochemical cells.

28. The method of claim 27, wherein generating the delta signal, applying the delta signal, and measuring the response signal are performed by an active measurement unit and further comprising sequentially and selectively coupling the active measurement unit to each of the plurality of electrochemical cells as the first set of cells.

29. The method of claim 22, wherein applying the delta signal and applying the opposite delta signal comprise applying DC signals.

30. The method of claim 22, wherein applying the delta signal and applying the opposite delta signal comprise applying time-varying signals.

* * * * *

UNITED STATES PATENT AND TRADEMARK OFFICE
CERTIFICATE OF CORRECTION

PATENT NO.        : 9,519,031 B2                          Page 1 of 1
APPLICATION NO.   : 14/108068
DATED             : December 13, 2016
INVENTOR(S)       : David K. Jamison It is certified that error appears in the above-identified patent and that said Letters Patent is hereby corrected as shown below:

In the Specification

| | | | |
|---|---|---|---|
| | Column 1, | Line 8, | change "DE-AC07-051D14517" to --DE-AC07-05ID14517-- |
| | Column 10, | Line 3, | change "by earful placement" to --by careful placement-- |
| | Column 12, | Line 58, | change "Vm1drives" to --Vm1 drives-- |
| | Column 13, | Line 50, | change "(see FIG 11)" to --(see FIG. 11)-- |

In the Claims

| | | | |
|---|---|---|---|
| Claim 1, | Column 14, | Line 35, | change "cells are" to --cells is-- |
| Claim 10, | Column 15, | Line 44, | change "cells are operably couples" to --cells is operably coupled-- |
| Claim 10, | Column 15, | Line 50, | change "signal which" to --signal, which-- |
| Claim 17, | Column 16, | Line 34, | change "cells wherein" to --cells, wherein-- |
| Claim 17, | Column 16, | Line 35, | change "cells are" to --cells is-- |
| Claim 17, | Column 16, | Line 47, | change "being and" to --being applied and-- |
| Claim 22, | Column 17, | Line 29, | change "cells are" to --cells is-- |

Signed and Sealed this
Fourteenth Day of November, 2017

Joseph Matal
*Performing the Functions and Duties of the
Under Secretary of Commerce for Intellectual Property and
Director of the United States Patent and Trademark Office*